United States Patent
Ha Woo et al.

(10) Patent No.: US 9,165,790 B2
(45) Date of Patent: Oct. 20, 2015

(54) PACKAGING SUBSTRATE, METHOD FOR MANUFACTURING SAME, AND CHIP PACKAGING BODY HAVING SAME

(71) Applicant: Zhen Ding Technology Co., Ltd., Tayuan, Taoyuan (TW)

(72) Inventors: Yong Ha Woo, Kwang myung (KR); E-Tung Chou, Taoyuan (TW); Wen-Lun Lo, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 92 days.

(21) Appl. No.: 13/968,409

(22) Filed: Aug. 15, 2013

(65) Prior Publication Data
US 2014/0117553 A1   May 1, 2014

(30) Foreign Application Priority Data
Oct. 30, 2012   (CN) .......................... 2012 1 0422734

(51) Int. Cl.
| H01L 23/48 | (2006.01) |
| H01L 29/40 | (2006.01) |
| H01L 21/48 | (2006.01) |
| H01L 23/498 | (2006.01) |

(52) U.S. Cl.
CPC ....... *H01L 21/4853* (2013.01); *H01L 23/49811* (2013.01); *H01L 23/49894* (2013.01); *H01L 2224/16225* (2013.01); *H01L 2224/32225* (2013.01); *H01L 2224/73204* (2013.01); *H01L 2224/92125* (2013.01); *H01L 2924/15311* (2013.01)

(58) Field of Classification Search
CPC ...................... H01L 23/5227; H01L 21/76879
USPC ........................................... 257/762; 438/672
See application file for complete search history.

(56) References Cited

U.S. PATENT DOCUMENTS

| 6,295,200 B1 * | 9/2001 | Schmidt ........................ 361/704 |
| 2002/0020898 A1 * | 2/2002 | Vu et al. ........................ 257/676 |
| 2004/0009629 A1 * | 1/2004 | Ahn et al. ..................... 438/108 |

* cited by examiner

*Primary Examiner* — Theresa T Doan
(74) *Attorney, Agent, or Firm* — Novak Druce Connolly Bove + Quigg LLP

(57) ABSTRACT

A packaging substrate includes a base layer, a first wiring layer, a second wiring layer, a first solder mask layer, a second solder mask layer and copper portions. The first second wiring layers are arranged on opposite sides of the base layer. The first solder mask layer covers the first wiring layer, and defines plenty of first openings. The first wiring layer exposed through the first openings serves as first contact pads. The second solder mask layer covers the second wiring layer. The second solder mask layer defines plenty of second openings. The second wiring layer exposed through the second openings serves as second contact pads. The copper portions are formed on the second contact pads. The copper portions protrude beyond the second solder mask layer. This disclosure further relates to a method of manufacturing the packaging substrate and a chip packaging body.

7 Claims, 12 Drawing Sheets

PACKAGING SUBSTRATE, METHOD FOR MANUFACTURING SAME, AND CHIP PACKAGING BODY HAVING SAME

BACKGROUND

1. Technical Field

The present disclosure relates to a packaging substrate, a method for manufacturing the same, and a packaging body having the packaging substrate.

2. Description of Related Art

A chip packaging body may include a packaging substrate and a chip. The packaging substrate includes a wiring layer formed on a dielectric layer. The wiring layer includes a plurality of contact pads. The chip is electrically connected to the contact pads through a plurality of solder balls. In a process of mounting the chip on the packaging substrate, solder materials are applied on the contact pads and are melted to form solder balls. Then electrodes of the chip contact the solder balls. Finally, the solder balls are hardened by cooling. However, it is difficult to reduce volumes of the solder balls to obtain a chip packaging body having a high density of solder balls.

What is needed therefore is a packaging substrate, a method for manufacturing the same, a chip packaging body having the same to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Various embodiments will now be described in detail below with reference to the drawings.

FIGS. 1-12 show a method for manufacturing a chip packaging body in accordance with an exemplary embodiment. The method includes the following steps.

Figure 1:
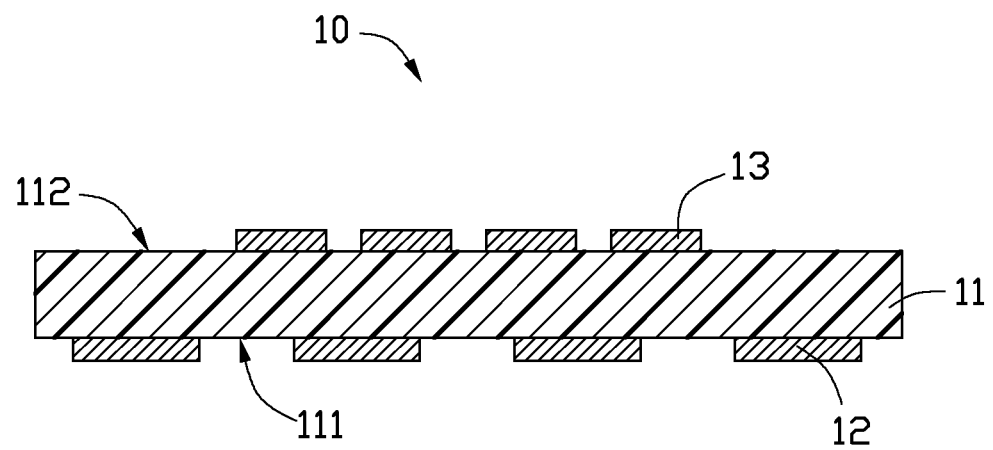
FIG. 1 is a cross-sectional view of a wiring board in accordance with an exemplary embodiment.

FIG. 1 shows that in step 1, a wiring board 10 comprising a base layer 11, and a first wiring layer 12 and a second wiring layer 13 formed on opposite sides of the base layer 11 is provided.

The base layer 11 is a multi-layer structure comprising a plurality of dielectric layers and a plurality of wiring layers alternately laminated on each other in stack. The base layer 11 includes a first surface 111 and an opposite second surface 112. The first wiring layer 12 is formed on the first surface 111. The second wiring layer 13 is formed on the second surface 112. The first wiring layer 12 and the second wiring layer 13 each can be formed by selectively etching a copper foil. The wiring layers of the base layer 11 and the first and second wiring layers 12 and 13 can be electrically connected to each other through a number of conductive vias (not shown) formed in the dielectric layers of the base layer 11.

Figure 2:
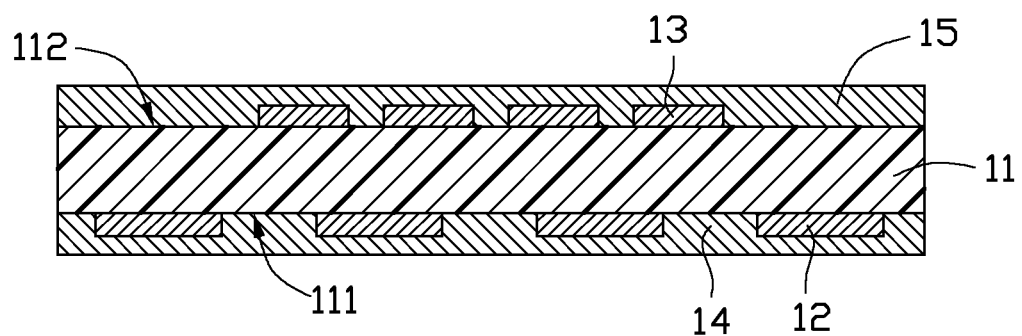
FIG. 2 shows a first solder mask layer and a second solder mask layer formed on the wiring board of FIG. 1.

FIG. 2 shows that in step 2, a first solder mask layer 14 is formed on the first wiring layer 12 and a second solder mask layer 15 is formed on the second wiring layer 13. The first solder mask layer 14 covers the entire first wiring layer 12 and the first surface 111. The second solder mask layer 15 covers the entire second wiring layer 13 and the second surface 112.

Figure 3:
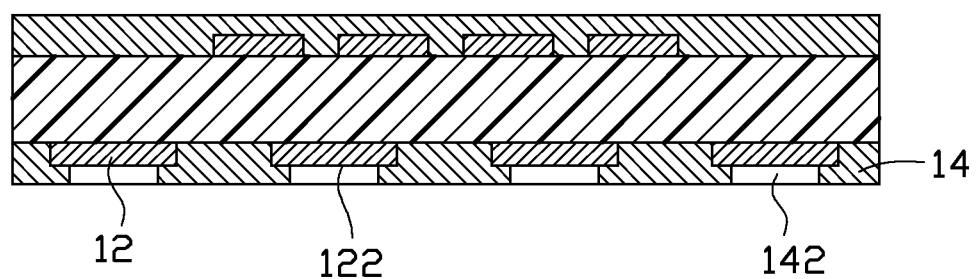
FIG. 3 shows a plurality of first openings for exposing a plurality of first contact pads in FIG. 2.

FIG. 3 shows that in step 3, a plurality of first openings 142 is defined in the first solder mask layer 14 to expose portions of the first wiring layer 12. The portions of the first wiring layer 12 exposed through the first openings 142 serve as first contact pads 122. The first openings 142 can be formed by a laser bombardment method.

Figure 4:
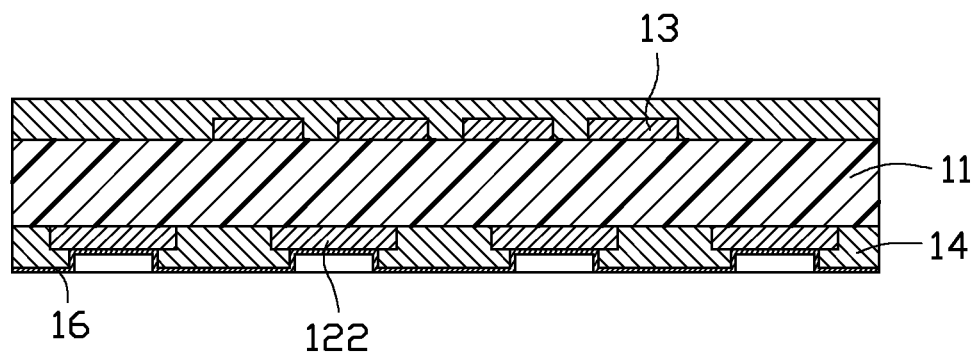
FIG. 4 shows a continuous metal layer formed on the first contact pads and the first solder mask layer in FIG. 3.

FIG. 4 shows that in step 4, a continuous metal layer 16 is formed on a surface of the first solder mask layer 14, inner surfaces of the first openings 142, and on surfaces of the first contact pads 122. Thus, the metal layer 16 is electrically connected to the first contact pads 122. Because the first contact pads 122 are electrically connected to the second wiring layer 13, the metal layer 16 is electrically connected to the second wiring layer. The metal layer 16 can be formed by a sputtering method or an electroless plating method.

Figure 5:
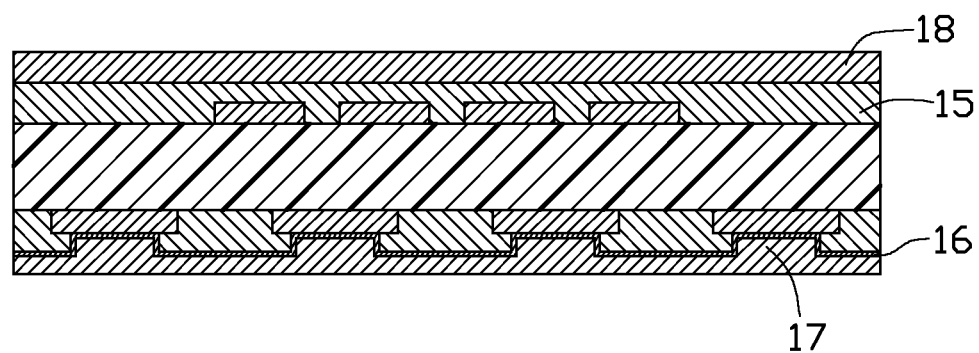
FIG. 5 shows a first plated-resist layer formed on the continuous metal layer, and a second plated-resist layer formed on the second solder mask layer.

FIG. 5 shows that in step 5, a first plated-resist layer 17 is formed on the metal layer 16, and a second plated-resist layer 18 is formed on the second solder mask layer 15. In this embodiment, the first and second plated-resist layers 17 and 18 are made of dry-film photo-resist materials. In an alternative embodiment, the first and second plated-resist layers 17 and 18 can also be made of wet-film photo-resist materials. The first plated-resist layer 17 protects the metal layer 16 from being contaminated by copper etchant in a following electroplating process.

Figure 6:
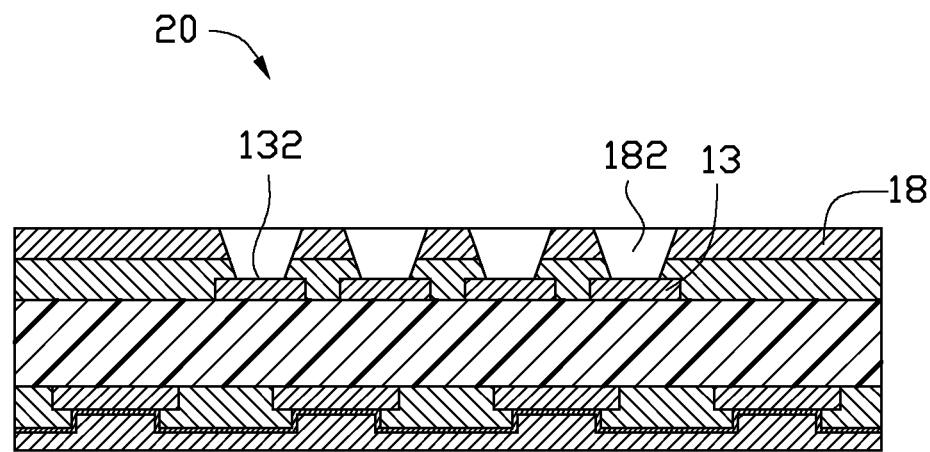
FIG. 6 shows a plurality of second openings exposing a plurality of second contact pads of FIG. 5.

FIG. 6 shows that in step 6, a plurality of second openings 182 is defined through the second plated-resist layer 18 and the second solder mask layer 15 to expose portions of the second wiring layer 13, thereby obtaining a multi-layer substrate 20. The portions of the second wiring layer 13 exposed through the second openings 182 serve as second contact pads 132.

In this embodiment, the second openings 182 can be formed by a laser bombardment method. The second openings 182 are frustoconical tapering from the second plated-resist layer 18 to the second wiring layer 13. In an alternative embodiment, the second openings 182 can be cylindrical.

The order of the steps 3-6 can be changed to the following order. First, the second plated-resist layer 18 is formed on the surface of the second solder mask layer 15. Second, the second openings 182 are defined through the second plated-resist layer 18 and the second solder mask layer 15, and the first openings 142 are defined in the first solder mask layer 14. Third, the continuous metal layer 16 is formed on a surface of the first solder mask layer 14, the inner surfaces of the first openings 142, and the surfaces of the first contact pads 122. Then, the first plated-resist layer 17 is formed on the continuous metal layer 16.

Figure 7:
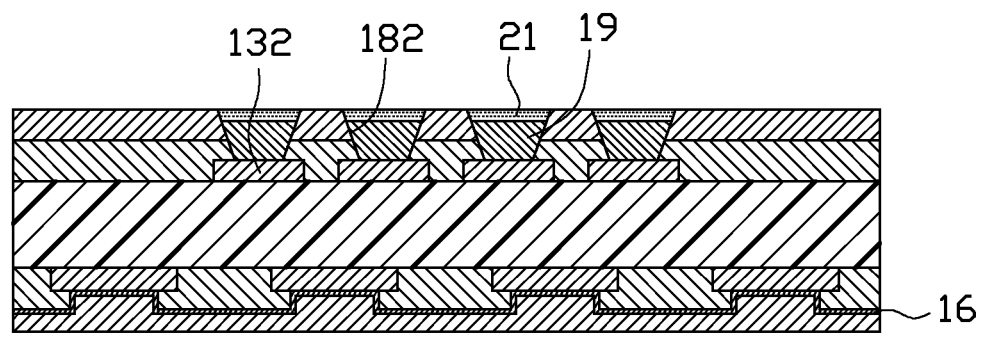
FIG. 7 shows copper portions respectively formed on the second contact pads in FIG. 6 using an electroplating method.

FIG. 7 shows that in step 7, copper portions 19 are respectively formed on the second contact pads 132 in the second openings 182 by using an electroplating method. Then, one solder layer 21 is formed on each of the copper portions 19. The copper portions 19 protrude beyond the surface of the second solder mask layer 15.

In the electroplating process of step 7, the multi-layer substrate 20 is placed in a plating bath (not shown) receiving a copper etchant. An anode of a power supply is submerged in the copper plating solution, and a cathode of the power supply is connected to the metal layer 16. Because the metal layer 16 is electrically connected to the second wiring layer 13, copper is plated onto the second contact pads 132 of the second wiring layer 13 to form the copper portions 19.

The solder layer 21 can be made of tin paste. Each of the second openings 182 is defined by a single shot of a laser bombardment method, thus the second openings 182 can be very small in size, resulting in very small copper portions 19.

Figure 8:
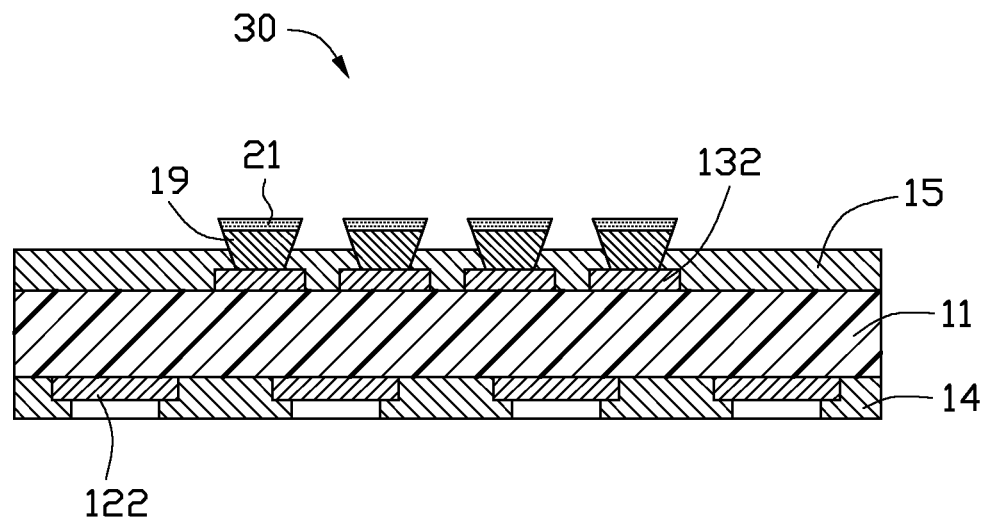
FIG. 8 shows the first plated-resist layer, the metal layer and the second plated-resist layer in FIG. 8 removed, obtaining a packaging substrate.

FIG. 8 shows that in step 8, the first plated-resist layer 17 and the second plated-resist layer 18 are removed, and then the metal layer 16 is removed. Thus, a packaging substrate 30 is obtained.

The first and second plated-resist layer 17 and 18 can be removed by a peeling method. The metal layer 16 can be removed by an etching method.

In step 8, the first plated-resist layer 17 is removed first. Then, the copper layer 16 is removed by an etching method. Finally, the second plated-resist layer 18 is removed. Thus, a packaging substrate 30 is obtained.

In this embodiment, the packaging substrate 30 includes the base layer 11, the first wiring layer 12, the second wiring layer 13, the first solder mask layer 14, the second solder mask layer 15, and a plurality of copper portions 19. The first and second wiring layers 12 and 13 are respectively formed on the first surface 111 and the second surface 112 of the base layer 11. The first solder mask layer 14 covers the first wiring layer 12 and is filled in the gap between wirings of the first wiring layer 12. The first solder mask layer 14 defines a plurality of first openings 142 for exposing portions of the first wiring layer 12. The portions of the first wiring layer 12 exposing through the first openings 142 serve as the first contact pads 122. The second solder mask layer 15 defines a plurality of second openings 182 for exposing portions of the second wiring layer 13. The portions of the second wiring layer 13 exposing through the second openings 182 serve as the second contact pads 132. The copper portions 19 are respectively formed on the second contact pads 132, and protrude beyond the surface of the second solder mask layer 15. The copper portions 19 are frustoconical tapering toward the second contact pads 132. One solder layer 21 is formed on a top surface of each of the copper portions 19. The copper portions 19 can also be cylindrical.

Figure 9:
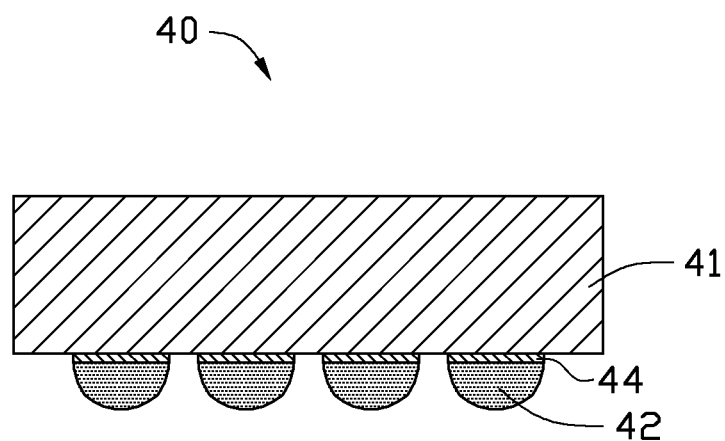
FIG. 9 is a cross-sectional view of a chip in accordance with the exemplary embodiment.

FIG. 9 shows that in step 9, a chip 40 is provided. The chip 40 includes a chip body 41, a plurality of electrodes 44 and a plurality of first solder balls 42 respectively formed on the electrodes 44. The electrodes 44, the solder balls 42, and the copper portions 19 have an equal number. A material of the solder balls 42 can be tin.

Figure 10:
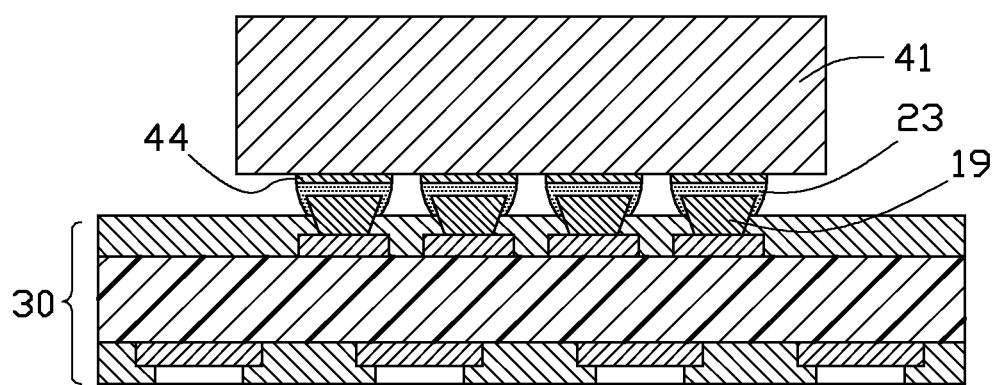
FIG. 10 shows the chip of FIG. 9 mounted on the packaging substrate of FIG. 8.

FIG. 10 shows that in step 10, the chip 40 is mounted on the packaging substrate 30. The first solder balls 42 are respectively bound to the copper portions 19, thus soldering the electrodes 44 of the chip 40 respectively on the copper portions 19.

The first solder balls 42 can be bound to the copper portions 19 in a method as follows. First, the chip 40 is placed on the packaging substrate 30 with the first solder balls 42 contacting the solder layers 21 on the copper portions 19. Second, each of the first solder balls 42 and the corresponding solder layer 21 are melted using reflow soldering to form a second solder ball 23 having a single continuous body of material. The second solder ball 23 encapsulates the corresponding copper portion 19. The electrodes 44 of the chip 40 are bonded to the copper portions 19 via the second solder balls 23. When there is no solder layers 21, the first solder balls 42 are melted to bond to the copper portions 19 using reflow soldering.

Figure 11:
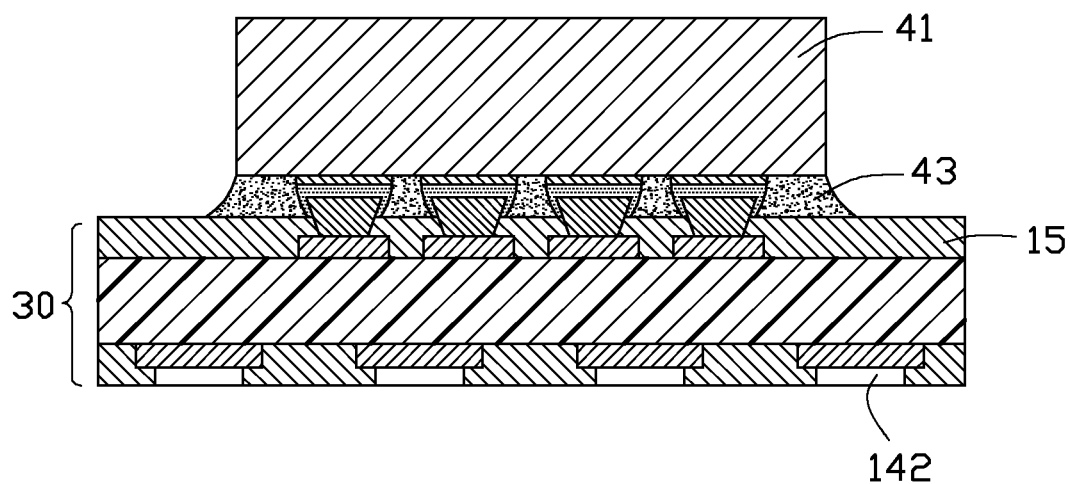
FIG. 11 shows an underfill layer is formed in a gap between the chip and the packaging substrate in FIG. 10.

FIG. 11 shows that in step 11, an underfill material is infilled in a gap between a bottom surface of the chip body 41 and the surface of the packaging substrate 30, forming an underfill layer 43. Thus, the underfill layer 43 firmly fixes the chip 40 to the packaging substrate 30. The underfill is filled through capillary action of the gap between the bottom surface of the chip 40 and the surface of the second solder mask layer 15 when the underfill is arranged at the opening of the gap. The underfill layer 43 can be comprised of an epoxy resin, such as LOCTITE 3536.

Figure 12:
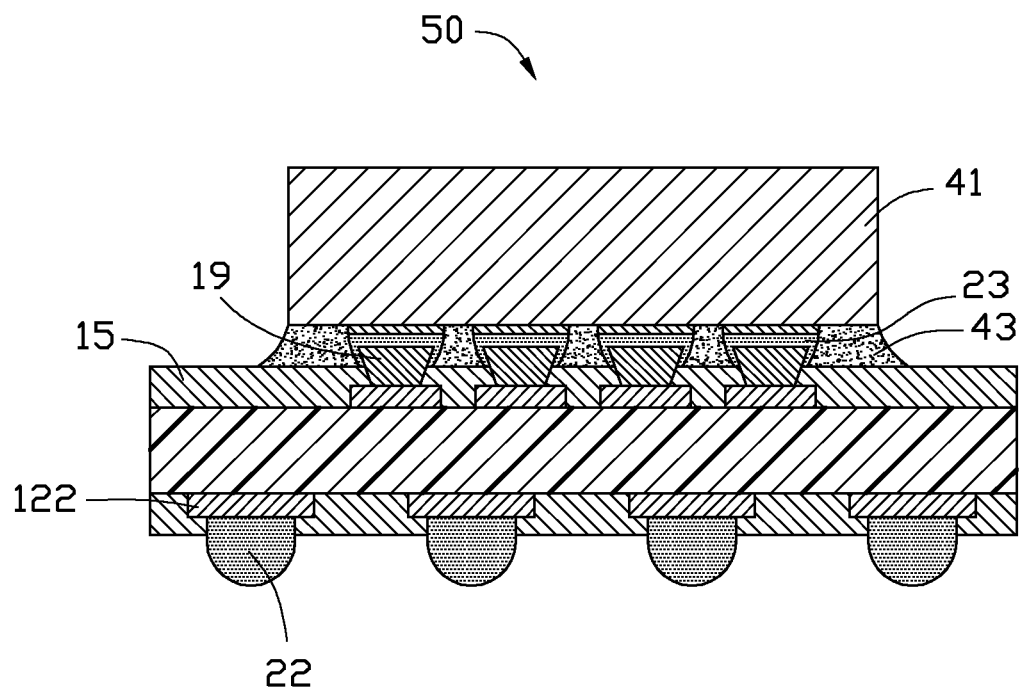
FIG. 12 shows solder ball respectively formed on the first contact pads of the packaging substrate in FIG. 11.

FIG. 12 shows that in step 12, solder material is filled in to overflowing in the first openings 142, thereby forming a plurality of third solder balls 22 respectively electrically connected to the first conductive pads 122. Thus, a chip packaging body 50 is obtained.

In practice, the method of steps 1-12 can be a roll-to-roll process. In this case, the chip packaging body 50 includes a plurality of chip packaging body pieces connected end to end. A cutting step, by machine or by laser beam, is then included to separate the endless length of chip packaging body 50 into chip packaging body pieces.

The chip packaging body 50 includes the packaging substrate 30, the chip 40 and the underfill layer 43. The chip 40 includes the chip body 41 and the electrodes 44 arranged at a side of the chip body 41. The packaging substrate 30 includes the copper portions 19. The electrodes 44 are respectively bonded to the copper portions 19 through a plurality of second solder balls 23. The underfill layer 43 is infilled in a gap between the bottom surface of the chip body 41 and the surface of the packaging substrate 30 to firmly fix the chip 40 to the packaging substrate 30.

In this embodiment, the second openings 182 is defined by a laser bombarding method. Thus, the second openings 182 can be formed to be smaller. That is, the copper portions 19 conformed to the second openings 182 can be smaller. Each of the copper portions 19 serves as an inner core of the second solder balls 23. Thus, the second solder balls 23 can have very less solder materials for fixing the pillar pumps 19 to the electrodes 41 of the chip 40. Therefore, each of the second solder balls 23 and the corresponding copper portion 19 cooperatively form a finer bonding structure for bonding the electrode 41 and the second contact pads 132. Thus, the chip packaging body 50 can have a high density of the bonding structures.

While certain embodiments have been described and exemplified above, various other embodiments from the foregoing disclosure will be apparent to those skilled in the art. The present disclosure is not limited to the particular embodiments described and exemplified, but is capable of considerable variation and modification without departure from the scope and spirit of the appended claims.

The invention claimed is:

1. A packaging substrate, comprising:
   a base layer comprising a first surface and a second surface opposite to the first surface;
   a first wiring layer formed on the first surface and a second wiring layer formed on the second surface;
   a first solder mask layer covering the first wiring layer and the first surface, the first solder mask layer defining a plurality of first openings to expose the first wiring layer, the first wiring layer exposed through the first openings serving as first contact pads;
   a second solder mask layer covering the second wiring layer and the second surface, the second solder mask layer defining a plurality of second openings to expose the second wiring layer, the second wiring layer exposed through the second openings serving as second contact pads, the second openings being frustoconical tapering toward the second wiring layer; and
   a plurality of copper portions respectively formed on and electrically connected with the second contact pads in the second openings and being frustoconical tapering toward the second contact pads, the copper portions protruding beyond a surface of the second solder mask layer.

2. The packaging substrate of claim 1, further comprising a plurality of solder layers respectively formed on top surfaces the copper portions.

3. The packaging substrate of claim 1, wherein the base layer is a multi-layer structure comprising a plurality of dielectric layers and a plurality of wiring layers alternately laminated one on another.

4. A chip packaging body, comprising:
   a packaging substrate of claim 1; and
   a chip comprising a chip body and a plurality of electrodes arranged at a side of the chip body, the chip mounted on the packaging substrate with the electrodes respectively bonded to the copper portions through solder material.

5. The chip packaging body of claim 4, further comprising an underfill layer filled in a gap between a bottom surface of the chip and a surface of the second solder mask layer of the packaging substrate.

6. The chip packaging body of claim 4, wherein the copper portions are frustoconical tapering from top surfaces thereof to the second contact pads.

7. The chip packaging body of claim 4, wherein the base layer is a multi-layer structure comprising a plurality of dielectric layers and a plurality of wiring layers alternately laminated one on another.

* * * * *